United States Patent [19]

Michikami et al.

[11] 4,412,902
[45] Nov. 1, 1983

[54] METHOD OF FABRICATION OF JOSEPHSON TUNNEL JUNCTION

[75] Inventors: Osamu Michikami, Tohkai; Yujiro Katoh, Mito; Keiichi Tanabe, Mito; Hisataka Takenaka, Mito; Shizuka Yoshii, Mito, all of Japan

[73] Assignee: Nippon Telegraph & Telephone Public Corporation, Musashino, Japan

[21] Appl. No.: 390,116

[22] Filed: Jun. 18, 1982

[30] Foreign Application Priority Data

| Jun. 22, 1981 | [JP] | Japan | 56-96129 |
| Jul. 6, 1981 | [JP] | Japan | 56-105345 |
| Aug. 3, 1981 | [JP] | Japan | 56-121577 |
| Aug. 3, 1981 | [JP] | Japan | 56-121578 |
| Aug. 17, 1981 | [JP] | Japan | 56-128439 |
| Feb. 16, 1982 | [JP] | Japan | 57-24194 |

[51] Int. Cl.³ .................. C23C 15/00; H01L 39/22
[52] U.S. Cl. ........................ 204/192 E; 156/643; 357/5; 427/62; 427/63
[58] Field of Search ........... 204/192 E, 192 EC, 164, 204/192 S; 29/599; 357/5; 156/643; 427/39, 62-63

[56] References Cited

PUBLICATIONS

R. B. van Dover et al., "Superconductor-Normal-Superconductor Microbridges," *J. Appl. Phys.*, vol. 52, No. 12, pp. 7327-7343 (Dec. 1981).
R. W. Freedman et al., "Selective Plasma Etching of Niobium," *IBM Tech. Disc. Bull.*, vol. 20, pp. 1601-1603 (1977).
T. T. Foxe et al., "Reactive Ion Etching of Niobium," *J. Vac. Sci. Technol.*, vol. 19, No. 4, pp. 1394-1397 (Nov. Dec. 1981).
S. A. Reible, "Reactive Ion Etching in the Fabrication of Niobrium Tunnel Junctions," *IEEE Trans. on Magnetics*, vol. MAG-17, No. 1, pp. 303-306 (Jan. 1981).
R. F. Broom et al., "Niobium Oxide-Barrier Tunnel Junction," *IEEE Trans. Electron Devices*, vol. Ed.-27, No. 10, pp. 1998-2008 (Oct. 1980).

*Primary Examiner*—Aaron Weisstuch
*Attorney, Agent, or Firm*—Cushman, Darby & Cushman

[57] ABSTRACT

There is disclosed a method of fabrication of a Josephson tunnel junction device. A surface of a base electrode of Nb or Nb compound is subjected to sputter cleaning and then to plasma oxidation in an atmosphere of a diluent gas and oxygen to form thereon an oxide layer serving as a tunnel barrier. A counter electrode is then formed on the oxide layer to provide the Josephson tunnel junction.

30 Claims, 11 Drawing Figures

METHOD OF FABRICATION OF JOSEPHSON TUNNEL JUNCTION

BACKGROUND OF THE INVENTION

1. Field of the Invention

This invention relates to a method for the fabrication of a Josephson junction.

2. Prior Art

In recent years, it has been necessary to deal with a great quantity of information and to speedily deal with highly technological calculations. For this reason, computers have now been extensively used to process such data. It has now been desired to develop high-speed switching elements to enable computers to process data more rapidly. One of such switching elements is a Josephson junction, and among Josephson junctions, a Josephson tunnel junction is most preferred in that it has excellent switching characteristics. The Josephson tunnel junction is known as an ultra-high speed switching element. The Josephson tunnel junction can be operated at a lower rate of power consumption and at an extremely higher rate of speed in comparison with silicon semiconductor devices commonly used in computers as a switching element.

The Josephson tunnel junction is of a simple construction and comprises a base electrode, a counter electrode, and a layer of insulating barrier sandwiched between the base and counter electrodes, the barrier layer having a thickness of 30 to 70 Angstroms.

A typical example of Josephson junctions employs either lead or lead alloy as a base material, and an investigation of integrated junctions has now been made using such a base material. The Josephson junction made of lead or lead alloy has the advantage that it has good reproducible characteristics. However, since lead alloy has a relatively low melting point and is soft, its junction characteristics are liable to be degraded by a temperature difference or thermal cycling between an operating temperature (4.2 K in liquid helium) and room temperature. In addition, a fine processing or working of lead alloy is rather difficult because of its soft nature. On the other hand, superconductors made of either niobium (Nb) or niobium compounds have a high melting point and are hard. Therefore, such a superconductor has good anti-thermal cycling properties and can be finely processed or worked. A problem of this superconductor is that it has not yet had junction characteristics suitable for an integrated junction structure. Accordingly, a study of junction fabrication techniques with respect to superconductors of niobium or niobium compounds has now been made. "Niobium oxide-barrier tunnel junction" is disclosed by Ronald F. Broom et al in IEEE TRANSACTIONS ON ELECTRON DEVICES, VOL. ED-27, OCTOBER 1980, PAGES 1198-2007. They describe the fabrication and electrical characteristics of niobium oxide-barrier tunnel junctions. Also, the oxidation of lead films by rf sputter etching in oxygen plasma is disclosed by J. H. Greiner in *Journal of Applied Physics*, Vol. 45, No. 1, January 1974, Pages 32-37. A method of forming thin oxide layers by sputter etching in a low-power rf oxygen discharge (rf oxidation) is described in it.

SUMMARY OF THE INVENTION

It is an object of this invention to provide a method of fabrication of a Josephson tunnel junction device having a base electrode of Nb, a Nb compound, or a V compound, in which the junction surface of the base electrode is subjected to cleaning so as to be smooth and free of damage, and is subjected to oxidation to form an oxide barrier on which a counter electrode is formed, thereby allowing the Josephson junction to have excellent junction characteristics.

Another object is to provide a method by which the tunnel junction has less leakage current.

A further object is to provide a method by which the Josephson junction has excellent thermal cycling properties and can be easily processed or worked so that an integrated junction structure can be provided.

Conventionally, in the fabrication of a Josephson tunnel junction using either Pb or Nb, when the tunnel barrier is to be formed after the formation of a lift-off pattern, the junction surface of the base electrode is cleaned by a sputter-cleaning method using argon (Ar) ions. An extensive study of Josephson junctions using Pb has heretofore been made. In the case of Josephson junctions using Nb, good electrical characteristics have not easily been achieved by Ar sputter-cleaning. With the conventional Ar sputter-cleaning method, it is thought that good junction properties are not achieved due to damage of the junction surface and the formation of lower oxides which serve as the tunnel barrier. In the case of Josephson junctions using Pb, an extensive study has heretofore been made with respect to the oxidation of a first superconductor film or base electrode to form an oxide barrier film thereon after the sputter-cleaning. In the formation of an oxide barrier through plasma oxidation, using a mixture gas of oxygen and argon, the oxide film depends on the oxidation speed and on how long it takes for the introduced mixture gas to reach a predetermined pressure in a chamber. In the plasma oxidation, in order to avoid the influence of an initial oxide film, the conditions for the Ar sputtering and the oxidation speed are so determined as to control the oxide barrier film to a thickness suitable for a superconducting current. Thus, the thickness of the oxide barrier is properly controlled. On the other hand, in the case of Josephson junctions using Nb, oxidation conditions for suitably controlling the thickness of the oxide barrier have not yet been found.

According to the present invention, there is provided a method for the fabrication of a Josephson junction which comprises the steps of forming a film of base electrode of a first superconductor metal on a substrate; subjecting a surface of the base electrode to sputter-cleaning in the presence of a halogenated hydrocarbon selected from the group consisting of fluorinated hydrocarbon ($CnF_{2n+n}$: n=1~4), trifluoromethane ($CHF_3$), trichlorofluoromethane ($CCl_3F$), trifluorobromomethane ($CBrF_3$), dichlorodifluoromethane ($CCl_2F_2$), trifluoroethane ($C_2H_3F_3$) and pentafluoroethane ($C_2HF_5$); oxidizing the cleaned surface of the base electrode in the presence of a gas mixture of oxygen and inert gas to form an oxide layer on the base electrode; and forming a film of counter electrode of a second superconductor metal on the oxide layer.

DESCRIPTION OF THE INVENTION

A method of the fabrication of a Josephson tunnel junction according to the present invention utilizes a photo processing technique. The steps of forming the Josephson junction by the photo processing technique are shown in FIGS. 1A to 1G.

Figure 1A:
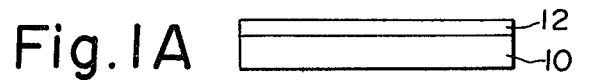
FIGS. 1A to 1G are explanatory views showing the steps of formation of a Josephson junction according to the present invention.

FIG. 1A shows the step of forming a superconductor film serving as a base electrode for the Josephson junction.

A substrate 10 of silicon has an oxidized silicon film formed on its surface by a thermal oxidation method. The substrate may also be made of sapphire. A film 12 of superconductor metal such as Nb is formed on the substrate 10, for example, by sputtering, this first superconductor film 12 serving as a base electrode.

Figure 1B:
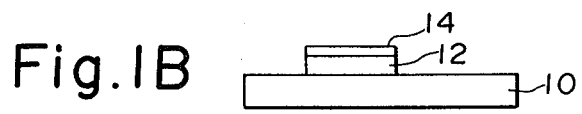

FIG. 1B shows the step of patterning the superconductor film 12. The base electrode 12 is subjected to photoresist coating, light exposure, development and sequential etching. The etchant used is composed of hydrogen fluoride (HF), nitric acid, and lactic acid. Reference numeral 14 designates the photoresist. The resultant pattern of the base electrode 12 has a width of 20 μm.

Figure 1C:
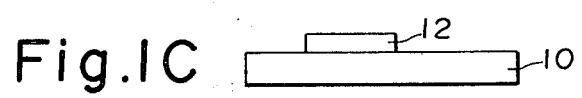

FIG. 1C shows the pattern of the base electrode 12 from which the photoresist 14 has been removed.

Figure 1D:
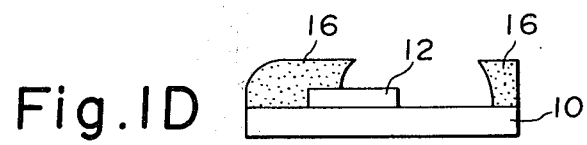

FIG. 1D shows the step of forming a lift-off pattern. A part of the substrate 10 and a part of the base electrode 12 are coated with a photoresist stencil 16. The stencil 16 may be replaced by any other suitable coating or masking.

Figure 1E:
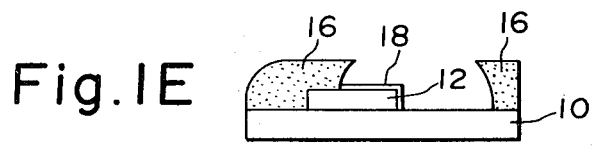

FIG. 1E shows the step of forming a tunnel barrier film 18 on the base electrode 12. According to an important feature of the present invention, the base electrode 12 is subjected to sputtering in the presence of fluorine-containing hydrocarbon to be first cleaned and rendered damage-free. Subsequently, the thus cleaned surface of the base electrode 12 is subjected to oxidation to form the oxide film or barrier 18 of good quality thereon.

Figure 1F:
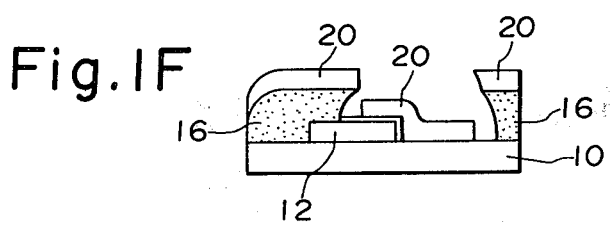

FIG. 1F shows the step of forming a second superconductor film 20 of lead (Pb) to provide the Josephson tunnel junction, the second superconductor film 20 serving as an upper or counter electrode. The counter electrode may also be made of the same material as the base electrode 12.

Figure 1G:
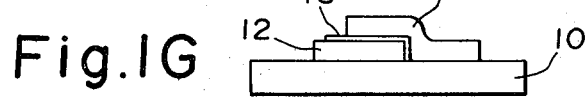

FIG. 1G shows the resultant Josephson tunnel junction when the lift-off photoresist stencil 16 has been removed.

Figure 2:
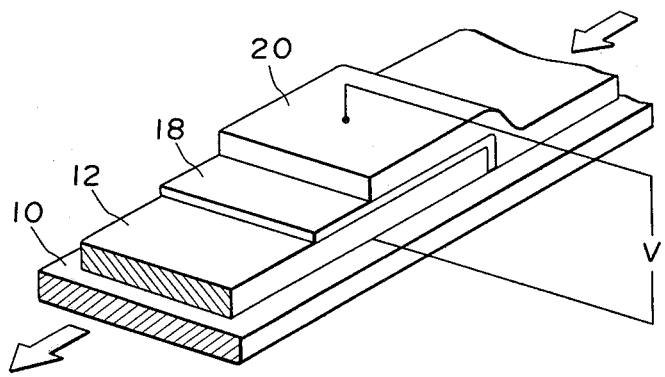
FIG. 2 is a fragmentary perspective view of the Josephson junction.
Figure 3:
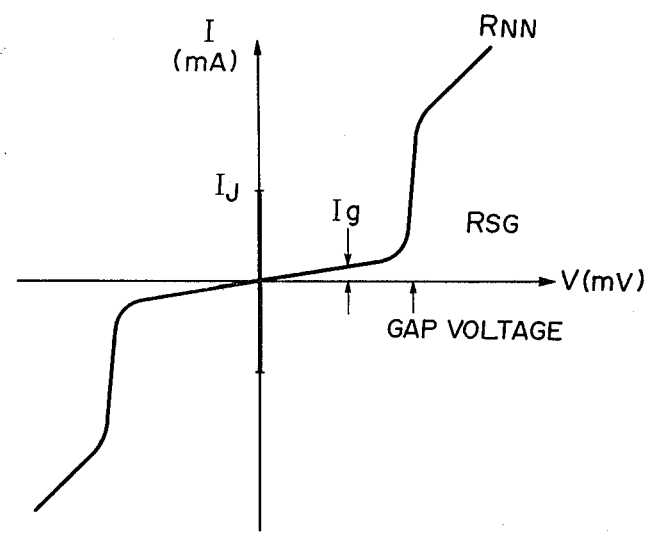
FIG. 3 is a graph showing V-I characteristics of the Josephson junction.

The Josephson tunnel junction thus obtained is composed of the base electrode 12, the counter electrode 20, and the oxide-tunnel barrier 18 interposed between the base and counter electrodes 12 and 20. FIG. 2 shows a typical example of such Josephson junctions. The insulating oxide barrier 18 has a thickness of 30 to 70 Angstroms. When electrical current I passes through thwe Josephson junction at a temperature below a superconductive transition temperature in the direction indicated by arrows in FIG. 2, a voltage V develops between the counter electrode 20 and the base electrode 12. FIG. 2 shows a graph illustrating the V-I characteristics of one example of the Josephson junction. When the base electrode 12 and the counter electrode 20 are connected to a power source, initially current passes through the Josephson junction even at zero voltage. At this point, superconductive electrons are delivered by a tunnel effect, and this condition is referred to as a zero voltage state. However, when current of above a predetermined value (the maximum Josephson current) flows through the Josephson junction, the Josephson junction is transited to a resistive state. At this point, normally conductive electrons are delivered by a tunnel effect, and this condition is referred to as a limited resistive state. A switching operation of the Josephson junction is effected through its transition from the zero voltage state to the limited resistive state. When current further flows through the Josephson junction at the limited resistive state, the voltage is linearly increased. The resistivity at this limited resistive state is referred to as junction resistance $R_{NN}$. When the current is reduced at the limited resistive state, the voltage is maintained substantially at a gap voltage of the Josephson junction regardless of the reduction of the current. When the current is further reduced, the voltage is linearly reduced. This resistance below the gap voltage is referred to as subgap resistance $R_{SG}$.

The Josephson tunnel junction exhibits non-linear V-I characteristics as described above. These characteristics depend largely on the qualities of the superconductor electrodes and tunnel barrier of the Josephson junction. The subgap voltage reflects the superconductivity of the electrodes at interfaces thereof. The superconductive properties of the electrodes can be easily affected by the crystallizability of the electrodes and the impurities therein. The superconductive current depends largely on the thickness of the tunnel barrier which is extremely thin, on the order of 30 to 70 Angstroms. Electrical characteristics of the Josephson junction are determined by the quality of the tunnel barrier and its uniformity in thickness.

The Josephson junction having a low subgap resistance will develop leakage current. The presence of such leakage current is due to the degradation of the interfaces of the Josephson junction and the defective tunnel barrier. Thus, an ideal Josephson tunnel junction is defined as one comprising the two superconductor metal films or electrodes, having a perfect crystallizability, and the tunnel barrier of uniform thickness sandwiched between the two superconductor films.

Generally, the grade or quality of the Josephson junction is represented by the degree of the leakage current. More specifically, the quality of the Josephson junction is represented by either the product $V_m$ of $I_J$ and $R_{SG}$ or the ratio of $R_{SG}$ and $R_{NN}$. The more $I_J \cdot R_{SG} = (V_m)$ or $R_{SG}/R_{NN}$ becomes, the less the leakage current becomes, thereby improving the Josephson junction.

Niobium, niobium alloys, and vanadium compound can be used as the base electrode. The niobium alloys include Nb—Al, Nb—Ge, Nb—Sn and Nb—Ga. Niobium compounds include Nb—C—N and Nb—N. Pb—In and V—Si can also be used as the base electrode. A film of such a material is formed on the substrate, for example, by an electron beam deposition method or a sputtering method to provide the base electrode.

In the present invention, the ambient gas, in which the cleaning of the junction surface of the base electrode is carried out, is fluorine-containing hydrocarbon.

This surface cleaning is carried out prior to the formation of the tunnel barrier. As the ambient gas of fluorine-containing hydrocarbon or halogenated hydrocarbon, $CF_4$, $C_2F_6$, $C_3F_8$, $C_4F_{10}$, $CHF_3$, $C_2HF_5$, $C_2H_3F$, $CCl_2F_2$, $CCl_3F$, and $CBrF_3$ can be used. The sputter cleaning of the junction surface prior to the formation of the tunnel barrier is carried out, using as ambient gas fluorine-containing hydrocarbon and/or hydrocarbon containing fluorine, chlorine and bromine. The sputter cleaning is carried out using a low-voltage discharge. The fluorine-containing hydrocarbon produces F radicals. The F radicals chemically react with niobium or vanadium of the junction surface to produce volatile $NbF_5$ and $VF_5$. The so produced $NbF_5$ and $VF_5$ separate from the junction surface so that the surface cleaning is effected through this etching operation. This etching through the above chemical reaction is much higher in speed by comparison with Ar ion sputtering. A 100 to 150 Angstroms thick contaminated layer on the junction surface is etched in 30 to 50 minutes. Therefore, damage to the junction surface is reduced to a minimum level. In the case of a fluorine-containing hydrocarbon discharge, carbon is deposited on the cleaned junction surface. Thus, since the junction surface is coated with carbon, it is prevented from contact with oxygen at the time of gas exchange in the vacuum chamber. The thickness of carbon deposited on the junction surface depends on gas content, partial pressure, discharge time and discharge voltage of the fluorine-containing hydrocarbon, and also depends on the kind thereof.

In order to effect the discharge at a low voltage, the required total pressure of the gas is about 0.01 Torr. Generally, when a hydrocarbon gas containing fluorine is used in sputtering, the amount of deposition of carbon is increased. Therefore, in order to dilute fluorine-containing hydrocarbon in the ambient gas, inert gases such as Ar, He, Ne, Kr and Xe, and also $N_2$, CO, $CO_2$ and methane are used. When discharge is effected in an atmosphere of a gas mixture of fluorine-containing hydrocarbon diluted by Ar, He, Ne, Kr, Xe, etc., the amount of deposited carbon is decreased with an increase in the discharge voltage. The reason is that the deposited carbon is sputtered by ions of the inner gas. In order to obtain junction characteristics of uniform quality, it is necessary to control the deposited carbon to a predetermined thickness. When the kinds of fluorine-containing hydrocarbon and diluent gas, their contents and the sputtering gas pressure are determined, then the amount of deposited carbon depends on the discharge voltage and the discharge time. Generally, when the discharge voltage is held at a constant level, the amount of deposited carbon is increased with an increase in the discharge time. However, when an increase in the discharge voltage, the thickness of the deposited carbon reaches a predetermined level and is maintained at this saturated level. However, it is not desirable to control the amount of deposited carbon by varying the discharge voltage because the increased discharge voltage causes damage to the junction surface. When the content of fluorine-containing hydrocarbon is lowered by reducing the partial pressure, a long time for cleaning is required because the etching speed of the junction surface is lowered. On the other hand, it is quite effective to introduce oxygen into the gas mixture of fluorine-containing hydrocarbon and diluent gas at the time of the sputter cleaning.

Oxygen gas reacts with carbon deposited on the junction surface to produce CO or $CO_2$, thereby removing the deposited carbon. When the deposition and the removal of carbon are in an equilibrium condition, the amount or thickness of deposited carbon is kept to a constant level irrespective of the discharge time.

For example, when the discharge is carried out in a gas mixture of Ar, 7.5% $CF_4$ and 2% $O_2$ at a voltage of 200 V at a pressure of 0.015 Torr, a carbon film of 20 to 40 Angstroms is formed on the junction surface of Nb—Al in one minute, and even when the discharge is continued thereafter, the thickness of the deposited carbon is not substantially changed. However, the junction surface of the Nb—Al film is etched with passage of the discharge time. Thus, the addition of oxygen gas serves not only to control the amount of carbon on the junction surface but also to control the etching speed to a constant level.

In the present invention, the tunnel barrier is formed on the cleaned junction surface of the first superconductor film or base electrode by oxidation immediately after the above cleaning.

When the carbon-coated junction surface is oxidized by oxygen, part of the oxygen reacts with part of the carbon on the junction surface to produce CO or $CO_2$, thereby removing part of the carbon. Another part of the oxygen diffuses into the carbon on the junction surface to react with active atoms of Nb or V to form oxides of Nb or V. The oxygen to produce the oxides of Nb or V slowly approaches the superconductor metal of the base electrode to cause the reaction. In the case where the oxide barrier is formed after the junction surface of the superconductor metal is subjected to Ar ion-sputter cleaning, oxygen reacts with Nb or V immediately after it is introduced, to thereby produce lower oxides such as NbO, $Nb_2O$ or $VO_2$. According to the present invention, the deposited carbon serves to control the speed of oxidation of Nb or V so that higher oxides such as $Nb_2O_5$ and $V_2O_5$ constituting an insulator of a stable nature are formed on the junction surface and the lower oxides such as NbO, $Nb_2O$ or $VO_2$ are not formed on the junction surface. Thus, a tunnel barrier of high quality can be produced.

The deposited carbon on the junction surface plays an important role in the formation of the stable barrier. The oxidation conditions of the sputter cleaning according to the invention are significantly different from those of Ar sputter cleaning in that the former utilizes deposited carbon.

In the conventional formation of the Nb junction, the junction surface, which has been subjected to sputter cleaning in an Argon atmosphere, is oxidized in an atmosphere of Argon gas containing about 4% oxygen at a pressure of 0.0045 Torr at a discharge voltage of 30 to 40 V, thereby forming a tunnel barrier of a predetermined thickness. On the other hand, in the present invention, the junction surface, which has been subjected to sputter cleaning in an atmosphere of a gas mixture of fluorine-containing hydrocarbon and inert gas, is oxidized in an atmosphere of Argon gas containing 4 to 20% oxygen at a pressure of 0.005 to 0.08 Torr at a discharge voltage $V_{CSB}$ of 40 to 150 V, thereby forming the oxide barrier. Thus, the oxidation conditions of the present method, i.e., the oxygen concentration, the gas pressure and the discharge voltage, cover wider ranges as compared with the oxidation conditions of the conventional method in which the junction surface is subjected to Ar sputter cleaning. These oxidation conditions of the present invention serve to form the optimum oxide barrier. The reason for this is thought to be that the deposited carbon serves to form the stable oxides such as $Nb_2O_5$ and $V_2O_5$ on the junction surface during the oxidation because the deposited carbon controls the diffusion of the oxygen.

In the present invention, the sputter cleaning of the junction surface and the oxidation of the cleaned junction surface are carried out in a single continuous step so that the oxide tunnel barrier is formed on the cleaned junction surface. When the sputtering is carried out in an atmosphere of fluorine-containing hydrocarbon, inert gas and oxygen and when the oxygen content is increased to more than 25%, part of the deposited carbon reacts with part of the oxygen and is removed, and the remainder of the active oxygen reacts with the superconductor metal to form the oxide barrier. However, since 100 to 150 Angstroms thick outer surface layer of the thus formed oxide barrier contains impurities, this contaminated outer surface is removed by F radical etching. Thus, the cleaning of the junction surface and the oxidation of the junction surface can be simultaneously carried out in one continuous step to form the oxide barrier. It is necessary for the formation of the oxide barrier of stable insulating properties that the Nb or V of the junction surface is slowly oxidized and, that the discharge conditions and the oxygen content be selected that the oxidation of the junction surface is somewhat higher in speed than the removal of the deposited carbon by the oxygen. The invention will now be described in detail with respect to specific preferred embodiments thereof, it being understood that these examples are intended to be illustrative only and the invention is not intended to be limited to the materials, conditions, process parameters and the like recited herein. All parts and parcentages are by weight unless otherwise indicated.

EXAMPLE 1

Niobium and aluminium were melted by an arc melting method to prepare Nb-25.1 at % Al alloy. A target with a diameter of 100 mm$\phi$ was made of the alloy. Nb-25.1 at % Al alloy was deposited onto an oxidized surface of a silicon substrate held at 670° C. by d.c. magnetron sputtering in an argon atmosphere at a pressure of 0.01 Torr to form a Nb—Al film serving as a base electrode. The film was 3500 Angstroms in thickness. The superconducting transition temperature ($T_c$) was measured through the electrical resistivity of the Nb—Al film, using a four-probe method. The Nb—Al film had a $T_c$ temperature of 16.1° K. Then, in order to pattern the Nb—Al film, the film was subjected to resist-coating, light exposure, development and etching sequentially. The etchant used was composed of a mixture of hydrogen fluoride, nitric acid, and lactic acid. Then, a lift-off photoresist stencil was applied to part of the substrate and part of the patterned Nb—Al film. The junction area of the Nb—Al film was not covered with the photoresist stencil. Thereafter, the Nb—Al film surface was sputtered in an atmosphere of tetrafluoromethane ($CF_4$) to clean it, and then was subjected to plasma oxidation to form an oxide layer or barrier thereon. The above sputter-cleaning was carried out at a pressure of 1 to 0.001 Torr at a cathode voltage $V_{CSB}$ of 150 V for 2 min. Thereafter, the cleaned Nb—Al film was oxidized by plasma oxidation to form the oxide barrier thereon. The plasma oxidation was carried out in an atmosphere of argon and 4 vol. % oxygen at a pressure of 0.03 Torr, at a cathode voltage $V_{CSB}$ of 50 V for 8 min.

Then, a film of lead was deposited on the oxide barrier to form a counter electrode, thereby providing a Josephson junction. The Josephson junction so obtained was composed of the Nb—Al base electrode (width: 20 $\mu$m; thickness 3500 Å), the counter electrode of lead, and the Nb—Al oxide barrier sandwiched between the base and counter electrodes. Six Josephson junctions Nos. 12 to 17 in TABLE 1 were prepared in this manner.

Josephson junction No. 11 was prepared according to the above procedure except that the sputter cleaning was carried out in an Argon atmosphere.

Josephson junctions Nos. 18 and 19 were prepared according to the above procedure except that the oxidation of the Nb—Al film to form an oxide barrier thereon was carried out through a natural oxidation method. This natural oxidation was carried out in an atmosphere of argon and 20% vol. $O_2$ for 10 hours at atmospheric pressure at room temperature.

TABLE 1 shows V-I characteristics of the Nb—Al/Pb tunnel junctions Nos. 11 to 19 and the fabrication conditions thereof. They are classified into a tunneling type, a bridge type, and one particle tunneling type, according to their V-I characteristics. The gap voltage and $R_{SG}/R_{NN}$ representative of the quality of the junction were obtained through the V-I characteristics. As can be seen from TABLE 1, the Josephson junctions, subjected to the sputter cleaning in the presence of tetrafluoromethane ($CF_4$) and subsequently to the plasma oxidation, are of the tunneling type. The gap voltage and $R_{SG}/R_{NN}$ depend on the pressure of $CF_4$. Josephson junctions having excellent junction properties were obtained using a $CF_4$ pressure of 0.5 to 0.005 Torr. When the $CF_4$ pressure was below 0.005 Torr, the gas voltage was 3.2 mV. This is presumably due to the fact that the pressure is so low that the energies of the sputter particles become high enough to cause damage to the junction surface, thereby degrading the superconductive properties. On the other hand, when the $CF_4$ pressure exceeds 0.5 Torr, the amount of the deposited carbon is excessively increased. As a result, the etching effect is presumably adversely affected so that the contaminated layer on the junction surface can not fully be removed.

TABLE 1

| | Experiment number | | | | | | | | |
|---|---|---|---|---|---|---|---|---|---|
| | 11 | 12 | 13 | 14 | 15 | 16 | 17 | 18 | 19 |
| Sputter cleaning | | | | | | | | | |
| Argon: 0.01 Torr | | | | | | | | | |
| $V_{CBS}$ (V) | 300 | | | | | | | | 300 |
| Time (min.) | 10 | | | | | | | | 5 |
| Tetrafluoromethane | | | | | | | | | |
| Pressure (Torr) | | 1 | 0.5 | 0.1 | 0.01 | 0.005 | 0.001 | 0.1 | 0.1 |
| $V_{CBS}$ (V) | | 150 | 150 | 150 | 150 | 150 | 150 | 150 | 150 |
| Time (min.) | | 2 | 2 | 2 | 2 | 2 | 2 | 2 | 2 |

TABLE 1-continued

| | Experiment number | | | | | | | | |
|---|---|---|---|---|---|---|---|---|---|
| | 11 | 12 | 13 | 14 | 15 | 16 | 17 | 18 | 19 |
| Oxidation: | | | | | | | | | |
| Plasma oxidation Ar-4 vol. % $O_2$ 0.03 (Torr) | | | | | | | | | |
| $V_{CBS}$ (V) | 50 | 50 | 50 | 50 | 50 | 50 | 50 | | |
| Time (min.) | 8 | 8 | 8 | 8 | 8 | 8 | 8 | | |
| Oxidation room temperature | | | | | | | | | |
| Time (hr.) | | | | | | | | | 10 | 10 |
| Ar-10 vol. % $O_2$ one atm. | | | | | | | | | |
| Electrical characteristics of Nb—Al/Pb tunnel junction | | | | | | | | | |
| V-I characteristics | Bridge type | Bridge type or tunneling type | Tunneling type | Tunneling type | Tunneling type | Tunneling type | Bridge type | Tunneling type | Tunneling type |
| Gap voltage (mV) | — | 3 | 3.5 | 4.1 | 3.8 | 3.2 | — | 4.0 | 4.0 |
| $R_{SG}/R_{NN}$ | — | — | 4 | 8 | 10 | 7 | | 8.5 | 7.5 |

EXAMPLE 2

Nb—Al/Pb junctions were prepared in the same manner as described in Example 1 except that in the sputter cleaning, halogenated hydrocarbons such as hexafluoroethane $C_2F_6$, octafluoropropane $C_3F_8$, decafluorobutane $C_4F_{10}$, trifluoromethane $CHF_3$, pentafluoroethane $C_2HF_5$, trifluoropropane $C_2H_3F_3$, trichlorofluoromethane $CCl_3F$, $CF_4$—50 vol. % $CCl_3F$, $C_3F_8$—80 vol. % $CBrF_3$, and $C_2F_6$—20 vol. % $CF_4$ were used. The sputter cleaning was carried out at a pressure of 0.02 Torr at a cathode voltage $V_{CSB}$ of 150 V for 5 min. Thereafter, the cleaned Nb—Al film was oxidized by plasma oxidation to form an oxide barrier thereon. The plasma oxidation was carried out in an atmosphere of argon and 4% vol. oxygen at a pressure of 0.03 Torr, at a cathode voltage $V_{CSB}$ of 150 V for 5 min. A film of lead is deposited on the oxide barrier to form a counter electrode.

TABLES 2-1 and 2-2 show V-I characteristics of tunnel junctions Nos. 21 to 30 and the kind of the halogenated hydrocarbons used in the sputter cleaning. The pressure of the halogenated hydrocarbons was 0.02 Torr as can be seen from TABLES 2-1 and 2-2. The gap voltage and $R_{SG}/R_{NN}$ were obtained through the V-I characteristics and the Josephson junctions Nos. 21 to 30 were of the tunneling type.

TABLE 3-1 shows the content of $CF_4$ in helium and V-I characteristics of Nb—Al/Pb tunnel junctions Nos. 31 to 36. TABLE 3-2 shows the content of $CF_4$ in neon and V-I characteristics of Nb—Al/Pb tunnel junctions Nos. 37 to 42.

TABLE 3-3 shows the content of $CF_4$ in argon and V-I characteristics of Nb—Al/Pb tunnel junctions Nos. 43 to 48. TABLE 3-4 shows the content of $CF_4$ in carbon monoxide and V-I characteristics of Nb—Al/Pb tunnel junctions Nos. 49 to 54. The cleaned film was oxidized by plasma oxidation to form the oxide barrier thereon. The plasma oxidation was carried out in an atmosphere of argon and 4 vol. % oxygen at a pressure of 0.02 Torr. Then, a film of lead was deposited on the oxide barrier to provide a Josephson junction.

As can be seen from TABLES 3-1 to 3-4, the Josephson junction, subjected to the sputter cleaning in the presence of a gas mixture of 5 to 40 vol. % $CF_4$ and a diluent gas such as helium, neon, argon, carbon monoxide and subsequently to the plasma oxidation, are of the tunneling type.

As seen from the data in TABLES 3-1 to 3-4, Josephson junctions having excellent junction properties were obtained, using gas mixtures having a $CF_4$ content of 5 to 40 vol. %. As can be seen from TABLES 3-1 to 3-4, when $R_{SB}/R_{NN}$ of the junctions is above 8.5, the Josephson junctions are of the tunneling type. When the

TABLE 2

| | Experiment number | | | | | | | | | |
|---|---|---|---|---|---|---|---|---|---|---|
| | 21 | 22 | 23 | 24 | 25 | 26 | 27 | 28 | 29 | 30 |
| Sputter cleaning gas Fluorohydrocarbon at a pressure of 0.02 Torr | $C_2F_6$ | $C_3F_8$ | $C_4F_{10}$ | $CHF_3$ | $C_2HF_5$ | $C_2H_3F_3$ | $CCl_3F$ | $CF_4$ + 50 vol. % $CCl_3F$ | $C_3F_8$ + 50% vol. % $CBrF_3$ | $C_2F_6$ + 20% vol. % $CF_4$ |
| Electrical characteristics of Nb—Al/Pb tunnel junction | | | | | | | | | | |
| Gap voltage (mV) | 4.1 | 4.0 | 3.9 | 4.0 | 4.1 | 3.9 | 3.8 | 3.9 | 3.8 | 4.0 |
| Junction quality $R_{SG}/R_{NN}$ | 10.7 | 8.8 | 8.2 | 7.8 | 9.3 | 6.7 | 8.4 | 9.1 | 8.7 | 9.0 |

EXAMPLE 3

Nb—Al/Pb junctions were prepared in the same manner as described in Example 1 except that in the sputter cleaning, instead of $CF_4$, a gas mixture of $CF_4$ and a diluent gas was used. The diluent gases used therein were helium, neon, argon and carbon monoxide. The sputter cleaning was carried at a pressure of 0.02 Torr at a cathode voltage $V_{CSB}$ of 200 V for 10 min.

$CF_4$ content was below 5 vol. % the junctions do not have good junction properties. The reason for this is that the cleaning of the junction surface is incomplete. On the other hand, when the $CF_4$ content exceeds 40 vol. %, the amount of the deposited carbon is excessively increased so that good junction properties are not achieved. As a result, the etching effect is presumably adversely affected so that the contaminated layer on the junction surface can not fully be removed.

Nb—Al/Pb junctions were prepared in the same manner as described in this Example except that xenon, krypton, methane and carbon dioxide were used as diluent gas in the gas mixture and that niobium nitride (Nb—N) or Nb—Sn alloy was used as the base electrode.

to the plasma oxidation to form an oxide barrier thereon. Then, a film of lead was deposited on the oxide barrier to provide a Josephson junction. The Josephson junctions so obtained showed junction characteristics similar to those of the junctions subjected to the sputter cleaning in the presence of $CF_4$ and the dilute gas.

TABLE 3-1

|  | Experiment number | | | | | |
|---|---|---|---|---|---|---|
|  | 31 | 32 | 33 | 34 | 35 | 36 |
| Content of $CF_4$ in helium (Vol. %) | 2 | 5 | 15 | 40 | 60 | 100 |
| V-I characteristics | One particle tunneling type | Tunneling type | Tunneling type | Tunneling type | Tunneling type | Tunneling type |
| Gap voltage (mV) | 3.2 | 3.8 | 3.9 | 3.8 | 3.7 | 3.6 |
| $R_{SG}/R_{NN}$ | 3 | 8.5 | 11 | 9 | 8 | 8 |

TABLE 3-2

|  | Experiment number | | | | | |
|---|---|---|---|---|---|---|
|  | 37 | 38 | 39 | 40 | 41 | 42 |
| Content of $CF_4$ in neon (Vol. %) | 2 | 5 | 10 | 20 | 40 | 70 |
| V-I characteristics | One particle tunneling type | Tunneling type | Tunneling type | Tunneling type | Tunneling type | Tunneling type |
| Gap voltage (mV) | 2.9 | 3.7 | 3.8 | 3.9 | 3.8 | 3.6 |
| $R_{SG}/R_{NN}$ | 4 | 9 | 12 | 10 | 9 | 8 |

TABLE 3-3

|  | Experiment number | | | | | |
|---|---|---|---|---|---|---|
|  | 43 | 44 | 45 | 46 | 47 | 48 |
| Content of $CF_4$ in argon (Vol. %) | 2 | 5 | 10 | 20 | 40 | 70 |
| V-I characteristics | One particle tunneling type | Tunneling type | Tunneling type | Tunneling type | Tunneling type | Tunneling type |
| Gap voltage (mV) | 2.9 | 3.7 | 3.9 | 3.9 | 3.9 | 3.7 |
| $R_{SG}/R_{NN}$ | 4 | 9.5 | 13 | 11 | 9 | 9 |

TABLE 3-4

|  | Experiment number | | | | | |
|---|---|---|---|---|---|---|
|  | 49 | 50 | 51 | 52 | 53 | 54 |
| Content of $CF_4$ in carbon monoxide (Vol. %) | 2 | 5 | 10 | 20 | 40 | 70 |
| V-I characteristics | One particle tunneling type | Tunneling type | Tunneling type | Tunneling type | Tunneling type | Tunneling type |
| Gap voltage (mV) | 3.1 | 3.7 | 3.9 | 3.9 | 3.7 | 3.6 |
| $R_{SG}/R_{NN}$ | 3.8 | 8.5 | 11.5 | 9.7 | 9 | 8 |

The junctions were subjected to sputter cleaning in the presence of the gas mixture having a $CF_4$ content of 5 to 40 vol. % and subsequently to plasma oxidation. The values of $R_{SG}/R_{NN}$ obtained from the V-I characteristics were over 8.

Nb—Al/Pb junctions were prepared in the same manner as described in this Example except that instead of $CF_4$, trifluoromethane ($CHF_3$) or hexafluoroethane ($C_2F_6$) were used in the sputter cleaning.

The Nb—Al film surface was sputtered in an atmosphere of a gas mixture of $CHF_3$ or $C_2F_6$ and diluent gas such as helium, neon, argon, carbon monoxide, carbon dioxide, and methane, to clean it and then was subjected

EXAMPLE 4

A target with a diameter of 100 mm$\phi$ was made of Nb having a purity of 99.99%. Nb was deposited onto an oxidized surface of a silicon substrate by d.c. magnetron sputtering in an argon atmosphere to form a Nb film serving as a base electrode. Nb/Pb junctions were prepared in the same manner as described in Example 1 except that the sputtering was carried out in an atmosphere of argon, $CF_4$ and oxygen.

The Nb film was sputtered in an atmosphere of a gas mixture of argon—7.5 vol. % $CF_4$ or argon—7.5 vol. % $CF_4$—4 vol. % oxygen to clean its surface. The above sputter-cleaning was carried out at a pressure of 0.03 Torr at cathode voltage $V_{CSB}$ of 150 V for different times for the junctions.

Then, the cleaned Nb film surface was subjected to plasma oxidation to form an oxide barrier thereon. The plasma oxidation was carried out in a atmosphere of argon and 5 vol. % oxygen at a pressure of 0.03 Torr at a cathode voltage $V_{CSB}$ of 50 V for 5 min. Then, a film of lead was deposited on the oxide barrier to provide a Josephson junction.

Figure 4:
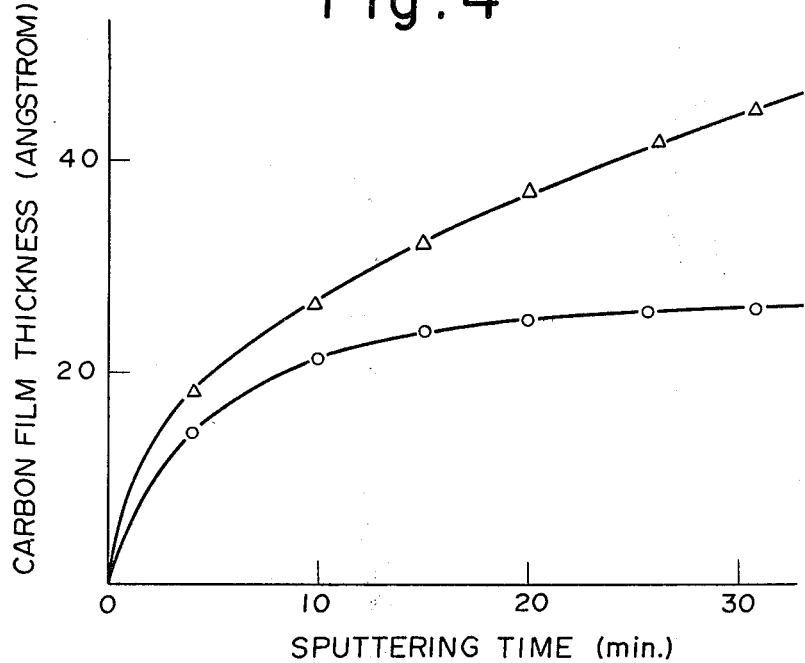
FIG. 4 is an illustration showing a relationship between a film of deposited carbon and sputtering time.

TABLE 4 shows V-I characteristics of the Nb/Pb tunnel junctions Nos. 55 to 60 and the fabrication conditions thereof. V-I characteristics of Nb/Pb tunnel junctions were represented both by the product of junction area A and $R_{NN}$ and $Vm=(I_j \cdot R_{SG})$. Each junction had a gap voltage of 2.7 mV. FIG. 4 shows the relationship between the sputter time and the thickness of the deposited carbon film measured by an elliprometric method. In FIG. 4, the lower or saturation curve represents a gas mixture of argon—7.5 vol. % $CF_4$—4 vol. % oxygen, and the upper curve represents a mixture gas of argon—7.5 vol. % $CF_4$. When the sputter-cleaning was carried out in an atmosphere of argon and 7.5 vol. % $CF_4$ to clean the Nb film surface, the amount of the deposited carbon on the Nb film was increased with an increase in the sputter time. On the other hand, when the sputter-cleaning was carried out in an atmosphere of argon, 7.5 vol. % $CF_4$ and 40 vol. % oxygen to clean the Nb film surface, the amount of the deposited carbon approached the saturation curve. In this saturated condition, the thickness of the deposited carbon film was about 20 Angstroms.

As can be seen from TABLE 4, the Josephson junctions, subject to the sputter-cleaning in the presence of a mixture gas of argon—7.5 vol. % $CF_4$—4 vol. % oxygen for 15 to 25 min., showed almost similar junction characteristics. This is presumably due to the fact that the amount of the deposited carbon is in the saturation state. The addition of oxygen serves to control the resistivity of the junction because a constant amount of the carbon could be deposited by the addition of an optimum amount of oxygen into $C_2F_6$ or $C_3F_8$ regardless of the sputter time.

Figure 5:
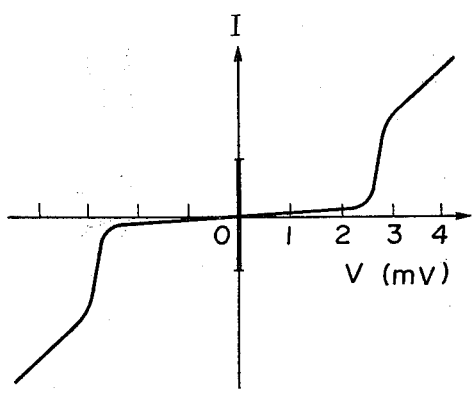
FIG. 5 is a graph showing V-I characteristics of the Josephson junction.

FIG. 5 shows V-I characteristics of Nb/Pb tunnel junction No. 58 that exhibits no knee on the V-I curve and less leakage current, which is advantageous.

Also, Nb/Pb tunnel junctions were prepared in the same manner as described above in this Example except that the oxygen content was varied. When the oxygen content was below 14 vol. %, the value of superconducting current $I_j$ was not zero. When the oxygen content exceeded 35 vol. %, Josephson junctions subjected to the sputter-cleaning and subsequently to the plasma oxidation showed one particle tunneling type. The reason for this is that the oxidation of the Nb film surface proceeds excessively due to an excessive oxygen content. Nb/Pb tunnel junctions, subjected to the sputter-cleaning in the presence of a mixture gas of argon—$CF_4$—5 to 35 vol. % oxygen and subsequently subjected to no plasma oxidation, have an oxidized barrier of 20 to 30 Angstroms thickness.

TABLE 4

|  | Experiment number | | | | | |
| --- | --- | --- | --- | --- | --- | --- |
|  | 55 | 56 | 57 | 58 | 59 | 60 |
| Sputter-cleaning gas: | Argon + 7.5 vol. % $CF_4$ subjected subsequently to the plasma oxidation | | | Argon + 7.5 vol. % $CF_4$ + 4 vol. % oxygen without plasma oxidation | | |
| Sputtering times (min.) | 15 | 20 | 25 | 15 | 20 | 25 |
| V-I characteristics | | | | | | |
| $A \cdot R_{NN}$ ($\Omega \cdot \mu m^2$) | $7 \times 10^4$ | $2 \times 10^4$ | $6 \times 10^3$ | $4.8 \times 10^5$ | $4.8 \times 10^5$ | $4.8 \times 10^5$ |
| Vm (mV) | 26 | 24 | 22 | 29 | 29 | 29 |

EXAMPLE 5

Nb/Pb tunnel junctions were prepared in the same manner as described in Example 1 except that niobium having a purity of 99.99% was used as a base electrode. The Nb film surface was sputtered in an atmosphere of argon and 10 vol. % $CF_4$ at a pressure of 0.03 Torr at a cathode voltage $V_{CSB}$ of 20 to 400 V for 20 min. to clean it, and thereafter the cleaned Nb film was subjected to plasma oxidation to form an oxide barrier thereon. The plasma oxidation was carried out at a cathode voltage $V_{CSB}$ of 50 V for 5 min. in an atmosphere of a gas mixture of argon and 5 vol. % oxygen at a pressure of 0.03 Torr. Then, a film of lead was deposited on the oxide barrier to provide a counter electrode.

TABLE 5 shows V-I characteristics of the Nb/Pb tunnel junctions Nos. 51 to 67 and cathode voltage $V_{CSB}$ of the sputter-cleaning. The Nb/Pb Josephson junctions are of the tunneling type and have a gap voltage of about 2.7 mV. When $V_{CSB}$ was below 50 V during the sputter-cleaning, a contaminated layer on the junction surface can not fully be removed. When $V_{CSB}$ exceeds 300 V, the energy of sputter particles become high enough to cause damage to the junction surface, thereby degrading the superconduction properties. Also Nb/Pb tunnel junctions subjected to sputter-cleaning at an atmosphere of argon—7% vol. $C_2F_6$—3% vol. oxygen or an atmosphere of argon—5% vol. $C_3F_8$—5% vol. nitrogen had junction characteristics similar to those of the above junctions in this Example. Further, tunnel junctions, subjected to sputter-cleaning at cathode voltage $V_{CSB}$ of 50 to 250 V and using Nb—Al, Nb—N, and Nb—Sn, respectively, as a base electrode, showed similar excellent tunnel junction properties.

TABLE 5

|  | Experiment number | | | | | | |
| --- | --- | --- | --- | --- | --- | --- | --- |
|  | 61 | 62 | 63 | 64 | 65 | 66 | 67 |
| Sputter-cleaning $V_{CBS}$ (V) | 20 | 50 | 100 | 150 | 200 | 300 | 400 |

TABLE 5-continued

| | Experiment number | | | | | | |
|---|---|---|---|---|---|---|---|
| | 61 | 62 | 63 | 64 | 65 | 66 | 67 |
| V-I characteristics | One particle tunneling type | Tunneling type | Tunneling type | Tunneling type | Tunneling type | Tunneling type | Bridge type |
| $R_{SG}/R_{NN}$ | 3.7 | 6.4 | 12.2 | 17.8 | 16.0 | 8.4 | — |
| Vm (mV) | 0 | 4.3 | 19 | 27 | 30 | 9.5 | — |

EXAMPLE 6

Nb-25.2 at % Ge, Nb-24.9 at % Sn, Nb-25.2 at % Ga, V-24.6 at % Si were prepared by an arc melting method to form a target with a diameter of 100 mmφ. These alloys were deposited onto a sapphire substrate held at 600° to 900° C. by d.c. magnetron sputtering in an argon atmosphere at a pressure of 0.045 to 0.2 Torr to form a film serving as a base electrode. The film was 4000 Angstroms in thickness. Also, Nb and Nb-15 atm % C were deposited respectively onto oxidized surfaces of silicon substrates by d.c. magnetron sputtering in argon and 20 vol. % $N_2$ atmosphere at a pressure of 0.01 Torr to form respectively Nb—N and Nb—C—N films serving as base electrodes. Each film was 4000 Angstroms in thickness.

Pb-10 at % In was deposited onto an oxidized surface of a silicon substrate by d.c. magnetron sputter to form a Pb—In film serving as a base electrode. Each of these base electrodes was sputtered in the same manner as described in Example 1. The sputter-cleaning was carried out in an atmosphere of a gas mixture of argon—10 vol. % $C_2F_6$—5 vol. % oxygen at a pressure of 0.025 Torr at a cathode voltage $V_{CSB}$ of 130 V for 20 min., then the cleaned surface of the base electrode was oxidized by plasma oxidation to form the oxide barrier thereon. The plasma oxidation was carried out in an atmosphere of argon and 4 vol. % oxygen at a pressure of 0.025 Torr at a cathode voltage $V_{CSB}$ of 50 V for 5 min. to form an oxide barrier thereon. Thereafter, a film of lead was deposited on the oxide barrier to provide a counter electrode.

TABLE 6 shows V-I characteristics of tunnel junctions Nos. 68 to 74.

EXAMPLE 7

Nb/Pb tunnel junctions were prepared in the same manner as described in Example 1 except that Nb of 99.99% purity was deposited onto an oxidized surface of a silicon substrate held at 400° C. by d.c. magnetron sputtering to form a Nb film serving as a base electrode. The Nb film was sputtered in an atmosphere of a gas mixture of argon, 7.5 vol. % $CF_4$ and 1 vol. % oxygen at a cathode voltage $V_{CSB}$ of 130 V for 20 min. Thereafter, the cleaned surfaces of the Nb films were oxidized by plasma oxidation in an atmosphere of argon and oxygen at various conditions (Total gas pressure, oxygen content, $V_{CSB}$, sputter time) to form different oxide barriers. Then, a film of lead was deposited on the oxide barrier to provide a counter electrode.

TABLE 7-1 shows the total gas pressure in the plasma oxidation and V-I characteristics of tunnel junctions Nos. 75 to 80.

TABLE 7-2 shows the oxygen content (vol. %) in the plasma oxidation and V-I characteristics of tunnel junctions Nos. 81 to 86.

TABLE 7-3 shows the cathode voltage $V_{CSB}$ in the plasma oxidation and V-I characteristics of tunnel junctions Nos. 87 to 92.

TABLE 7-4 shows the sputter time in the plasma oxidation and V-I characteristics of tunnel junctions Nos. 93 to 95.

As can be seen from TABLES 7-1 to 7-4, the Josephson junctions, subjected to the plasma oxidation at a total pressure of 0.005 to 0.06 Torr with an oxygen content of 4-20 vol. % at cathode voltage $V_{CSB}$ of 40 to 150 V for one to 20 min., are of the tunneling type.

TABLE 6

| | Experiment number | | | | | | |
|---|---|---|---|---|---|---|---|
| | 68 | 69 | 70 | 71 | 72 | 73 | 74 |
| Material of base electrode | Nb—Ge | Nb—Sn | Nb—Ga | V—Si | Nb—N | Nb—C—N | Pb—In |
| Superconducting transition temperature of base electrode Tc (K) | 21.5 | 15.6 | 17.7 | 15.4 | 15.9 | 15.3 | 7.8 |
| V-I characteristics | Tunneling type | Tunneling type | Tunneling type | Tunneling type | Tunneling type | Tunneling type | Tunneling type |
| $R_{SG}/R_{NN}$ | 8.1 | 12 | 8.4 | 10.3 | 15.6 | 11.6 | 14.5 |
| Vm (mV) | 18 | 22 | 17 | 20 | 29 | 24 | 26 |

TABLE 7-1

| | Experiment number | | | | | |
|---|---|---|---|---|---|---|
| | 75 | 76 | 77 | 78 | 79 | 80 |
| Oxidation: | | | | | | |
| $V_{CBS}$ 100 V Time 7 sec. Argon + 8 vol. % $O_2$ Total gas pressure (Torr) | 0.003 | 0.005 | 0.01 | 0.03 | 0.06 | 0.1 |

TABLE 7-1-continued

| | Experiment number | | | | | |
|---|---|---|---|---|---|---|
| | 75 | 76 | 77 | 78 | 79 | 80 |
| V-I characteristics: | Short | Tunneling type | Tunneling type | Tunneling type | Tunneling type | One particle tunneling type |
| $R_{SG}/R_{NN}$ | — | 8.5 | 11 | 17 | 14 | 10 |
| Vm (mV) | — | 14 | 18 | 30 | 22 | 2 |

TABLE 7-2

| | Experiment number | | | | | |
|---|---|---|---|---|---|---|
| | 81 | 82 | 83 | 84 | 85 | 86 |
| Oxidation: $V_{CBS}$ 100 V Time 7 sec. Argon + $O_2$ mixed gas Oxygen content (Vol. %) | 2 | 4 | 8 | 12 | 20 | 30 |
| V-I characteristics: | Short | Tunneling type | Tunneling type | Tunneling type | Tunneling type | One particle tunneling type |
| $R_{SG}/R_{NN}$ | — | 9.8 | 17 | 16 | 15 | 12 |
| Vm (mV) | — | 19 | 30 | 28 | 20 | 0 |

TABLE 7-3

| | Experiment number | | | | | |
|---|---|---|---|---|---|---|
| | 87 | 88 | 89 | 90 | 91 | 92 |
| Oxidation: Argon + 8 vol. % $O_2$ at 0.03 Torr Cathode voltage $V_{CBS}$ | 20 | 40 | 80 | 100 | 150 | 300 |
| V-I characteristics: | Short | Tunneling type | Tunneling type | Tunneling type | Tunneling type | Bridge type |
| $R_{SG}/R_{NN}$ | — | 14 | 20 | 17 | 11 | — |
| Vm (mV) | — | 21 | 32 | 30 | 18 | — |

TABLE 7-4

| | Experiment number | | | | | |
|---|---|---|---|---|---|---|
| | 75 | 76 | 77 | 78 | 79 | 80 |
| Oxidation: Argon + 8 % $O_2$ at 0.03 Torr Cathode voltage $V_{CBS}$ 80 V Plasma oxidation time (min.) | 1 | 3 | 7 | 10 | 20 | 30 |
| V-I characteristics: | Short | Tunneling type | Tunneling type | Tunneling type | Tunneling type | Tunneling type |
| $R_{SG}/R_{NN}$ | — | 10 | 20 | 22 | 16 | 12 |
| Vm (mV) | — | 17 | 32 | 34 | 25 | 0 |

What is claimed is:

1. A method for the fabrication of a Josephson tunnel junction device which comprises the steps of:
   (a) forming a base electrode film of a first superconductor metal on a substrate;
   (b) subjecting a surface of the base electrode film to sputter cleaning in the presence of a halogenated hydrocarbon selected from the group consisting of fluorinated hydrocarbons ($CnF_{2n+2}$:n=1~4), trifluoromethane ($CHF_3$), trichlorofluoroethane ($CCl_3F$), trifluorobromomethane ($CBrF_3$), dichlorodifluoromethane ($CCl_2F_2$), trifluoroethane ($C_2H_3F_3$) and pentafluoroethane ($C_2HF_5$);
   (c) oxidizing the cleaned surface of the base electrode in the presence of a gas mixture of oxygen and inert gas to form an oxide layer on the base electrode; and
   (d) forming a counter electrode film of a second superconductor metal on the oxide layer.

2. A method according to claim 1, in which the substrate is made of silicon which has an oxidized surface on which the base electrode is formed.

3. A method according to claim 1, in which the substrate is made of sapphire.

4. A method according to claim 1, in which the first superconductor metal is at least one metal selected from the group consisting of Nb, Nb—Al, Nb—Ge, Nb—Sn, Nb—Ga, V—Si, Nb—C—N, Nb—N, and Pb—In.

5. A method according to claim 1, in which the second superconductor metal is at least one metal selected from the group consisting of Nb, Nb—Al, Nb—Ge, Nb—Sn, Nb—Ga, V—Si, Nb—C—N, Nb—N, Pb, and Pb—In.

6. A method according to claim 1, in which the halogenated hydrocarbon is selected from the group consisting of tetrafluoromethane (CF$_4$)—50 volume % trichlorofluoromethane (CCl$_3$F), hexafluoroethane (C$_2$F$_6$)—20 volume % tetrafluoromethane (CF$_4$), and octafluoropropane (C$_3$F$_8$)—80 volume % trifluorobromomethane (CBrF$_3$).

7. A method according to claim 1, in which the inert gas used for the gas mixture in the oxidation step is selected from the group consisting of helium, argon, neon, xenon and krypton.

8. A method according to claim 1, in which the halogenated hydrocarbon in the sputter cleaning step is at a pressure of 0.5 to 0.005 Torr.

9. A method according to claim 1, in which the sputter cleaning step is carried out at a cathode voltage of 50 to 300 V.

10. A method according to claim 1, in which the oxidation of the cleaned surface of the base electrode is carried out by a plasma oxidation method.

11. A method according to claim 1, in which the oxidation of the cleaned surface of the base electrode is carried out by a natural oxidation method at room temperature.

12. A method according to claim 1, in which the pressure of the gas mixture of oxygen and inert gas in the oxidation step is between 0.005 to 0.08 Torr.

13. A method according to claim 1, in which the gas mixture in the oxidation step contains 4 to 20 volume % oxygen.

14. A method for the fabrication of a Josephson tunnel junction device which comprises the steps of:
(a) forming a base electrode film of a first superconductor metal on a substrate;
(b) subjecting a surface of the base electrode film to sputter cleaning in the presence of a diluent gas and a halogenated hydrocarbon selected from the group consisting of fluorinated hydrocarbons (CnF$_{2n+2}$:n=1~4), trifluoromethane (CHF$_3$), trichlorofluoromethane (CCl$_3$F), trifluorobromomethane (CBrF$_3$), dichlorodifluoromethane (CCl$_2$F$_2$), trifluoroethane (C$_2$H$_3$F$_3$), and pentafluoroethane (C$_2$HF$_5$);
(c) oxidizing the cleaned surface of the base electrode in the presence of a gas mixture of oxygen and inert gas to form an oxide layer on the base electrode; and
(d) forming a counter electrode film of a second superconductor metal on the oxide layer.

15. A method according to claim 14, in which the substrate is made of silicon which has an oxidized surface on which the base electrode is formed.

16. A method according to claim 14, in which the substrate is made of sapphire.

17. A method according to claim 14, in which the first superconductor metal is at least one metal selected from the group consisting of Nb, Nb—Al, Nb—Ge, Nb—Sn, Nb—Ga, V—Si, Nb—C—N, Nb—N, and Pb—In.

18. A method according to claim 14, in which the second superconductor metal is at least one metal selected from the group consisting of Nb, Nb—Al, Nb—Ge, Nb—Sn, Nb—Ga, V—Si, Nb—C—N, Nb—N, Pb, and Pb—In.

19. A method according to claim 14, in which the halogenated hydrocarbon is selected from the group consisting of tetrafluoromethane (CF$_4$)—50 volume % trichlorofluoromethane (CCl$_3$F), hexafluoroethane (C$_2$F$_6$)—20 volume % tetrafluoromethane (CF$_4$), and octafluoropropane (C$_3$F$_8$)—80 volume % trifluorobromomethane (CBrF$_3$).

20. A method according to claim 14, in which the inert gas used for the gas mixture in the oxidation step is selected from the group consisting of helium, argon, neon, xenon and krypton.

21. A method according to claim 14, in which the halogenated hydrocarbon in the sputter cleaning step is at a pressure of 0.5 to 0.005 Torr, the sputter cleaning being carried out at a cathode voltage of 50 to 300 V.

22. A method according to claim 14, in which the oxidation of the cleaned surface of the base electrode is carried out by a plasma oxidation method.

23. A method according to claim 14, in which the oxidation of the cleaned surface of the base electrode is carried out by a natural oxidation method at room temperature.

24. A method according to claim 14, in which the gas mixture in the oxidation step contains 4 to 20 volume % oxygen.

25. A method according to claim 14, in which the diluent gas is selected from the group consisting of helium, neon, argon, krypton, xenon, carbon monoxide, carbon dioxide, methane, and nitrogen.

26. A method for the fabrication of a Josephson tunnel junction device which comprises the steps of:
(a) forming a base electrode film of a first superconductor metal on a substrate;
(b) subjecting a surface of the base electrode film simultaneously to sputter cleaning and oxidation in the presence of a gas mixture of a diluent gas, oxygen, and a halogenated hydrocarbon selected from the group consisting of fluorinated hydrocarbons (CnF$_{2n+2}$:n=1~4), trifluoromethane (CHF$_3$), trichlorofluoromethane (CCl$_3$F), trifluorobromomethane (CBrF$_3$), dichlorodifluoromethane (CCl$_2$F$_2$), trifluoroethane (C$_2$H$_3$F$_3$) and pentafluoroethane (C$_2$HF$_5$), so that an oxide layer is formed on the base electrode; and
(c) forming a counter electrode film of a second superconductor metal on the oxide layer.

27. A method according to claim 26, in which the first superconductor metal is at least one metal selected from the group consisting of Nb, Nb—Al, Nb—Ge, Nb—Sn, Nb—Ga, V—Si, Nb—C—N, Nb—N, Pb, and Pb—In.

28. A method according to claim 26, in which the second superconductor metal is at least one metal selected from the group consisting of Nb, Nb—Al, Nb—Ge, Nb—Sn, Nb—Ga, V—Si, Nb—C—N, Nb—N, Pb, and Pb—In.

29. A method according to claim 26, in which the diluent gas is selected from the group consisting of helium, neon, argon, krypton, xenon, carbon monoxide, carbon dioxide, methane, and nitrogen.

30. A method according to claim 26, in which the gas mixture in the oxidation step contains 4 to 20 volume % oxygen, the total pressure of the gas mixture is 0.005 to 0.06 Torr, and the sputter cleaning and the oxidation is carried out at a cathode voltage of 40 to 150 V for 1 to 20 minutes.

* * * * *